(12) United States Patent
Xiang et al.

(10) Patent No.: US 6,218,245 B1
(45) Date of Patent: Apr. 17, 2001

(54) METHOD FOR FABRICATING A HIGH-DENSITY AND HIGH-RELIABILITY EEPROM DEVICE

(75) Inventors: Qi Xiang, Santa Clara; Xiao-Yu Li, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/198,654

(22) Filed: Nov. 24, 1998

(51) Int. Cl.[7] .................................................. H01L 21/8247
(52) U.S. Cl. ........................... 438/258; 438/475; 438/910
(58) Field of Search ............................... 438/38, 258, 264, 438/475, 910

(56) References Cited

U.S. PATENT DOCUMENTS

| | | | |
|---|---|---|---|
| 5,872,387 | * | 2/1999 | Lyding et al. ........................... 438/38 |
| 6,017,806 | * | 1/2000 | Harvey ................................. 438/475 |
| 6,071,751 | * | 2/1999 | Wallace et al. ........................ 438/38 |

OTHER PUBLICATIONS

Zhi Chen, Jinju Lee, Joseph W. Lyding, and Karl Hess, Deuterium Process of CMOS Devices: New Phenomena and Dramatic Improvement, *Symposium on VLSI Technology Digest of Technical Papers*, pp. 180–181 (1998).

J. W. Lyding, K. Hess, and I.C. Kizilyall, Reduction of hot electron degradation in metal oxide semiconductor translators by deuterium processing, *American Institute of Physics*, pp. 2526–2528 (1996).

* cited by examiner

*Primary Examiner*—Chandra Chaudhari
(74) *Attorney, Agent, or Firm*—Brinks Hofer Gilson & Lione

(57) ABSTRACT

A method for fabricating a high-density and high-reliability EEPROM device includes providing a semiconductor substrate having both an EEPROM cell region, and a peripheral MOS transistor region. A gate oxide layer is formed to overlie the peripheral MOS transistor region and the EEPROM cell region. A tunnel oxide region is formed to overlie a portion of the EEPROM cell region. Then, a polycrystalline silicon layer is formed to overlie both the gate oxide layer and the tunnel oxide region. A deuterium annealing process is then carried out to anneal the gate oxide layer and the tunnel oxide region. The polycrystalline silicon layer is patterned to form numerous gate electrodes including gate electrodes for peripheral transistors, floating-gate transistors, and read and write transistors in the EEPROM cell.

20 Claims, 3 Drawing Sheets

METHOD FOR FABRICATING A HIGH-DENSITY AND HIGH-RELIABILITY EEPROM DEVICE

BACKGROUND OF THE INVENTION

1. Field of the Invention

This invention relates, generally, to semiconductor devices and methods for their fabrication, and more particularly, to methods for fabricating EEPROM devices requiring extended data retention.

2. Description of the Prior Art

State of the art memory devices include both volatile and non-volatile memory devices. Volatile memory devices are those devices that require continuous electrical power to maintain stored charge within the memory cell. To maintain data in the memory of a volatile device, the memory cells must be continually refreshed, otherwise the stored charge will dissipate and the data will be lost. In contrast, non-volatile memory devices are capable of retaining stored data even after electrical power to the device is terminated. The non-volatile memory device typically stores electrical charge on either a separate gate electrode, known as a floating-gate, or in a dielectric layer underlying a control gate electrode. Data is stored in a non-volatile memory device by changing the threshold voltage of the floating-gate transistor. For example, in an n-channel floating-gate transistor an accumulation of electrons in the floating-gate electrode creates a high threshold voltage in the transistor. The presence or absence of electrical charge, or data, within an EEPROM memory cell is determined by the presence or absence of current flow through the floating-gate transistor as voltage is applied to the control-gate electrode.

One particular type of non-volatile memory device is the flash EEPROM. Flash EEPROMs are a type of EEPROM device that provides electrical erasing capability. The term "flash" refers to the ability to erase the memory cell simultaneously with electrical pulses. In an erased state, the threshold voltage of the floating-gate transistor is low, and, upon application of a turn-on voltage to the floating-gate electrode, an electrical current will flow through the transistor. When current is sensed flowing through the floating-gate transistor, charge is present on the floating-gate, which is defined as a logic 1 state. Conversely, when there is no charge on the floating-gate electrode, and a turn-on voltage is applied to the floating gate electrode, the transistor will not turn on, hence no current flows through the transistor. The absence of current flow then is defined as a logic 0 state.

EEPROM cells have recently been extensively used in programmable logic devices (PLDs). Most conventional EEPROM memory cells are formed with three transistors: a write transistor, a read transistor, and a floating-gate transistor (also known as a sense transistor). In the PLD EEPROM memory cell, the gate electrode of the write transistor and the read transistor are connected to the same word line. Also, the read transistor and the floating-gate transistor (or sense transistor) are connected to the same data line. Thus, when the read transistor is turned on, the floating-gate transistor is effectively used as the storage cell of the EEPROM.

To program the EEPROM device, a high voltage (between 13 and 15 volts), is applied to the word line of the EEPROM memory cell, and a relatively high voltage (approximately 11 to 12 volts) is applied to the electrode gate of the write transistor. This allows the voltage applied on the bit line to be transferred to the floating-gate electrode, thus placing charge on the floating-gate electrode.

To erase the EEPROM memory cell, a voltage $V_{cc}$ is applied to the word line of the write transistor. Because the gate electrodes are connected by the same word line, this also causes the read transistor to turn on. Ground potential is applied to the bit line, which is connected to the drain of the read transistor, and a high voltage (between 13 to 15 volts) is applied to the source region of the floating-gate transistor. Under these voltage conditions, the high voltage applied to the source is capacitively coupled to the floating-gate electrode, which causes electrons to tunnel from the floating-gate electrode through a tunnel oxide region and into the substrate, thereby erasing the EEPROM memory cell.

Over time, the EEPROM memory cell will be written and erased repeatedly as data is stored and removed from the memory cell. Since the EEPROM memory cell relies on charge exchange between the substrate and the floating-gate electrode, considerable stress is placed on the tunnel oxide underlying the floating-gate electrode. The charge-induced stress in the tunnel oxide can cause charge trapping sites to form within the tunnel oxide. The formation of these charge trapping sites is undesirable because, once formed, electrical current can leak through the tunnel oxide layer from the floating-gate electrode to the substrate. When charge leaks off the floating-gate electrode a data error occurs in the EEPROM memory cell. Depending upon the particular function performed by the EEPROM memory cell, the data error can cause catastrophic failure in an electronic system relying upon the EEPROM memory device.

One solution to the tunnel oxide leakage problem is to form thicker oxide layers within the EEPROM device. By providing more oxide, the formation of a small number of charged trapping sites can be tolerated without deleterious current leakage in the device. While fabricating the oxide layers to greater thicknesses reduce charge leakage problems, the thicker oxide layers prevent scaling of the overall size of the EEPROM memory cell. However, scaling down (reducing component size) of transistors having large oxide thicknesses cannot be achieved due to basic device physics. Thus, conventional EEPROM memory devices requiring transistors having relatively thick oxide layers cannot effectively be scaled down to smaller overall dimensions.

Another problem associated with EEPROM devices having relatively thick oxide layers relates to programming and erasing speed. As the thickness of the oxide layers increase, especially the tunnel oxide, the time required to transfer a charge between the substrate and the floating-gate electrode also increases.

Yet another problem suffered by conventional EEPROM devices is the lack of ability to scale down the large high-voltage transistors fabricated in the peripheral regions of the device. These high-voltage transistors are necessary to perform input and output functions, and to provide high-voltage power supply functions, and the like. These transistors typically have transistor geometries, such as gate lengths, that are significantly greater than the read and write transistors within the EEPROM cells. In order to significantly reduce component size and scale the device to smaller dimensions, it is necessary to fabricate both the high-voltage transistors and the memory cell transistors to smaller dimensions. Accordingly, an improved fabrication process is necessary to provide a high-reliability EEPROM device that can be programmed and erased at high speeds and that is fully scalable to smaller dimensions.

SUMMARY OF THE INVENTION

In practicing the present invention, there is provided a method for fabricating a high-density and high-reliability EEPROM device, in which the EEPROM device exhibits improved data retention by means of high-reliability gate oxide and tunnel oxide layers. Enhanced data retention is obtained by annealing the gate oxide and tunnel oxide layers in a deuterium atmosphere. The deuterium annealing process advantageously replaces hydrogen with deuterium at the silicon/silicon dioxide interface. Because deuterium is more stable, the formation of vacancies is minimized at the interface as charge is transferred across the tunnel oxide layer during operation of the device. Accordingly, charge trapping sites cannot readily form in the tunnel oxide layer. By minimizing the formation of charge trapping sites, the tunnel oxide layer does not readily leak charge from the overlying floating-gate electrode to the substrate. Experimental results show that MOS transistors fabricated in accordance with the invention exhibit substantially reduce stress-induced leakage characteristics as compared with transistors formed in accordance with the prior art.

Additionally, the deuterium annealing process reduces the deleterious effects associated with hot carrier induced threshold voltage shifting. Since the peripheral transistors are substantially larger than the EEPROM memory cell transistors, a reduction in gate dimensions of the peripheral transistors has a pronounced effect on the overall dimensions of an EEPROM device. By minimizing hot carrier injection, high-voltage transistors in the peripheral areas of an EEPROM device can be fabricated to have smaller gate dimensions.

In one form, a semiconductor substrate is provided having an EEPROM cell region, and a peripheral MOS transistor region. A silicon dioxide layer is formed to overlie the semiconductor substrate in the peripheral MOS transistor region, and to overlie semiconductor substrate in the EEPROM cell region. Then, a tunnel oxide region is formed in the EEPROM cell region, and a polycrystalline silicon layer is formed to overlie the silicon dioxide layer and the tunnel oxide region. In accordance with the invention, the semiconductor substrate is annealed in a deuterium atmosphere. After completing the annealing process, the polycrystalline silicon layer is patterned to form a peripheral MOS transistor gate electrode overlying the silicon dioxide layer in the peripheral MOS transistor region. Additionally, the polycrystalline silicon layer is patterned to form a floating-gate electrode overlying the tunnel oxide region in the EEPROM cell region.

Figure 1:
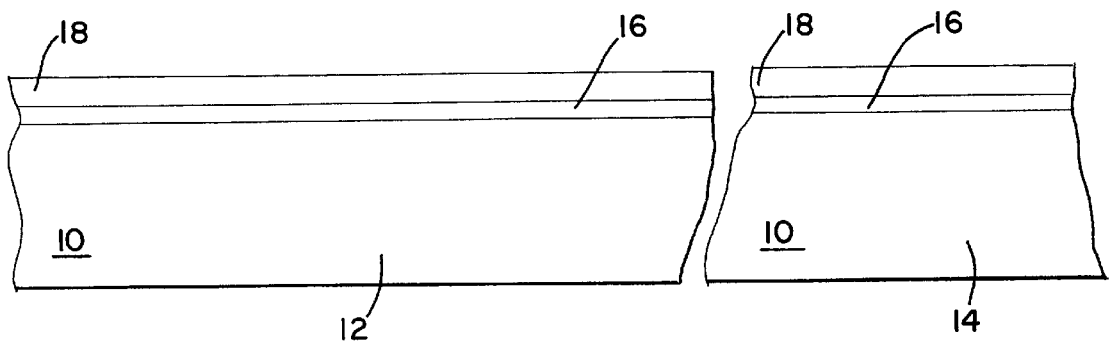
FIGS. 1–7 illustrate, in cross-section, process steps in accordance with the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF THE PREFERRED EMBODIMENTS

Shown in FIG. 1, in cross-section, are two portions of a semiconductor substrate 10 upon which MOS transistors are to be formed. Semiconductor substrate 10 includes a floating-gate transistor region 12 and a peripheral MOS transistor region 14. Preferably, semiconductor substrate 10 includes an epitaxial silicon layer overlying a single crystal silicon body. The epitaxial silicon is doped to have a p-type conductivity in preparation for the formation of n-type MOS transistors. Although the invention will be illustrated in the context of the fabrication of n-channel MOS transistors, those skilled in the art will appreciate that the EEPROM device of the present invention can also be fabricated using p-channel transistors.

The fabrication process begins with the formation of a pad oxide layer 16 and a silicon nitride layer ($Si_3N_4$) 18. Preferably, pad oxide layer 16 is a thermally grown silicon oxide layer having a thickness of about 500 to 2000 angstroms. Silicon nitride layer 18 is preferably a chemical-vapor-deposit silicon nitride layer having a thickness of about 1000 to 3000 angstroms.

Figure 2:
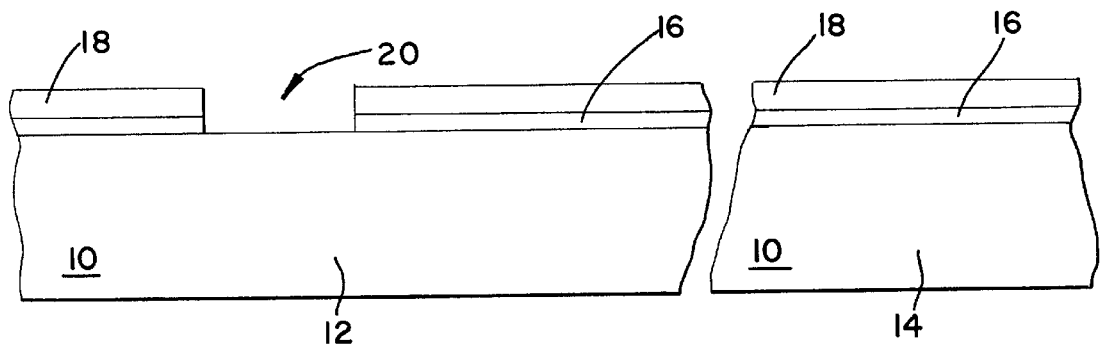

After forming pad oxide layer 16 and silicon nitride layer 18, photolithographic and etching processes are carried out to form an isolation opening 20 in a portion of pad oxide layer 16 and silicon nitride layer 18 overlying floating gate transistor region 12. As illustrated in FIG. 2, isolation opening 20 is formed at a precisely defined location over floating-gate transistor region 12. To properly position isolation opening 20, high-resolution photolithographic techniques are used to define a photoresist pattern (not shown) overlying silicon nitride layer 18. The photolithographic pattern is then transferred into the underlying silicon nitride and pad oxide layers by means of a selective, reactive-ion-etch (RIE) process. The RIE process selectively removes portions of silicon nitride layer 18 and pad oxide layer 16 exposed by the photolithographic pattern, while removing very little of the silicon surface of floating-gate transistor region 12. Those skilled in the art will appreciate that for the formation of high quality isolation regions it is important that the substrate surface not be damaged by this etching process.

Figure 3:
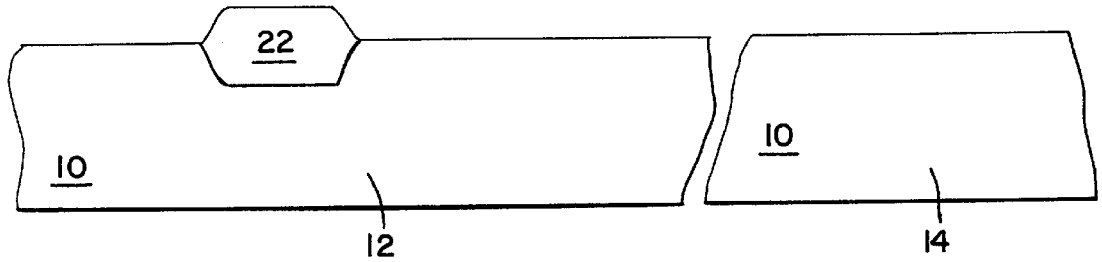

After forming isolation opening 20, a thermal oxidation process is carried out to form a thick isolation region 22, as illustrated in FIG. 3. Isolation region 22 is preferably formed to have a thickness of about 3000 to 5000 angstroms. Isolation region 22 is used to electrically isolate transistor components to be formed at the surface of floating-gate transistor region 12. In order to fabricate an EEPROM device in as small of substrate surface area as possible, it is important that isolation region 22 have a minimal lateral extent a cross the substrate surface. Although a localized-oxidation-of-silicon (LOCOS) process is illustrated, those skilled in the art will appreciate that other isolation techniques can be used, such as trench isolation, and the like. Once isolation region 22 is formed the remaining portions of silicon nitride layer 18 and pad oxide layer 16 are removed and the surface of semiconductor substrate 10 is exposed.

Figure 4:
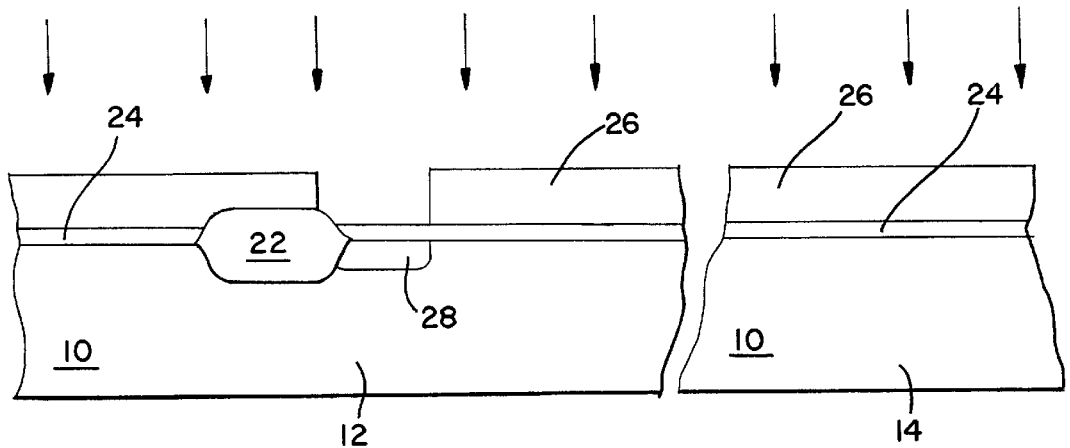

The inventive process continues, as shown in FIG. 4, with the formation of a sacrificial oxide layer 24. Preferably, sacrificial oxide layer 24 is formed by thermally oxidizing silicon within substrate 10 to form a silicon dioxide layer having a thickness of about 200 angstroms. Next, a photolithographic pattern 26 is formed on the surface of sacrificial oxide layer 24, and an ion implan process is carried out to form a doped region 28 in floating-gate transistor region 12.

Figure 5:
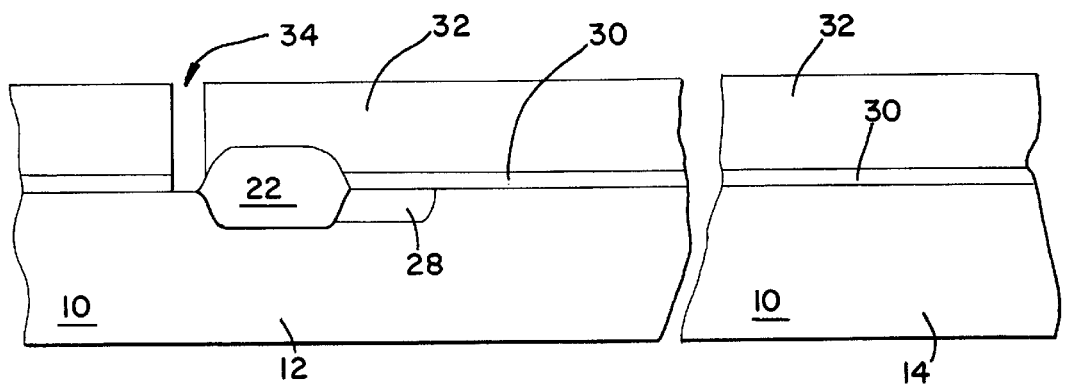

Upon the formation of doped region 28, photolithographic pattern 26 and sacrificial oxide layer 24 are removed to once again expose the surface of substrate 10. Then as illustrated in FIG. 5, a gate oxide layer 30 is formed on the surface of semiconductor substrate 10. Preferably, gate oxide layer 30 is formed by thermally oxidizing the silicon in semiconductor substrate 10 to form a silicon dioxide layer having a preferred thickness of about 100 to 300 angstroms, and more preferably having a thickness of about 150 angstroms. Those skilled in the art will appreciate that the formation of gate oxide layers, such as gate oxide layer 30, is an important step in tie fabrication process. The gate oxide layer must be a high quality dielectric having minimal contamination and it must be formed to a precisely determined thickness on the substrate surface. Preferably, a chlorinated thermal oxidation process is used to form a contaminate-free silicon dioxide layer on the surface of semiconductor substrate 10.

After forming gate oxide layer 30, a photolithographic pattern 32 is applied to gate oxide layer 30 to define an opening 34, over floating-gate transistor region 12. Next, an etching process is carried out to remove the portion of gate oxide layer 30 exposed by opening 34. Preferably, a selective oxide etch is used, such that almost no silicon from semiconductor substrate 10 is removed by the etch. Preferably, fluorinated etching gases are used in an RIE process to both selectively remove silicon dioxide over silicon, and to anisotropically etch gate oxide layer 30. The RIE etching process completely removes the portions of gate oxide layer 30 exposed by opening 34, such that a bare silicon surface is exposed adjacent to isolation region 22.

Figure 6:
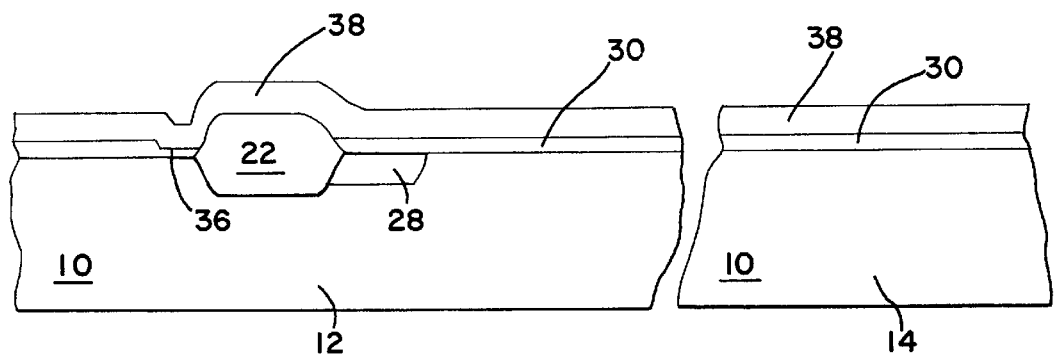

As shown in FIG. 6, the inventive process continues with the formation of a thin-tunnel oxide region 36 adjacent to isolation region 22. Again, the silicon surface of substrate 10 is thermally oxidized to form a thin silicon dioxide layer preferably having a thickness of about 60 to 100 angstroms, and more preferably, having a thickness of about 80 angstroms. In an alternative embodiment, the RIE process is terminated prior to completely removing the portion of gate oxide layer 30 exposed by opening 34. By prematurely terminating the RIE etch, a layer of silicon dioxide having the preferred thickness range remains on the surface of semiconductor substrate 10.

Following either of the tunnel oxide forming methods, a polycrystalline silicon layer 38 is deposited to overlie gate oxide layer 30 and tunnel oxide layer 36. Preferably, polycrystalline silicon layer 38 is formed by a chemical vapor deposition process to form a polycrystalline silicon layer having a thickness of about 2000 to 4000 angstroms. Either during deposition, or immediately afterward, polycrystalline silicon layer 38 is doped to have an n-type conductivity. Preferably, an n-type dopant, such as arsenic or phosphorus is introduced during chemical vapor deposition to render polycrystalline silicon layer 38 electrically conductive.

In accordance with a preferred embodiment of the invention, a deuterium annealing process is carried out to thermally anneal gate oxide layer 30 and tunnel oxide layer 36. During the deuterium annealing process, deuterium isotopes displace hydrogen atoms that previously bonded to silicon near the silicon dioxide/silicon interface at the surface of semiconductor substrate 10. An alignment mismatch occurs at the silicon/silicon dioxide interface because of the difference in inter-atomic distances between atoms in silicon dioxide and the silicon atoms in a single-crystal silicon body, such as semiconductor substrate 10. The different interatomic spacings between silicon dioxide and single-crystal silicon result in unpaired chemical bonds regularly dispersed at the interface. During processing, hydrogen atoms migrate to these unpaired bonds and take up bonding positions in the vacancies. The deuterium annealing step is carried out to displace the hydrogen atoms with deuterium atoms at the interface. As will subsequently be described in more detail, the presence of deuterium in the place of hydrogen provides a high quality gate oxide and tunnel oxide in which the deuterium atoms remain bonded to silicon at the interface throughout the lifetime of the EEPROM device.

Preferably, the deuterium annealing process is carried out at a temperature of about 400° C. to 500° C., and more preferably at a temperature of about 450° C. Semiconductor substrate 10 is placed in a thermal annealing furnace, and deuterium gas is introduced into the annealing furnace. The pressure within the furnace is controlled to a value of about 1.0 atmosphere and the deuterium annealing process is carried out for preferably about 120 to 240 minutes, and more preferably for about 180 minutes.

In an alternative embodiment of the invention, the foregoing deuterium annealing process can be carried out prior to the deposition of polycrystalline silicon layer 38. In the alternative embodiment, semiconductor substrate 10 is placed in a deuterium annealing apparatus immediately after formation of tunnel oxide layer 36. Substantially the same deuterium annealing process is then carried out to anneal gate oxide layer 30 and tunnel oxide layer 36.

Figure 7:
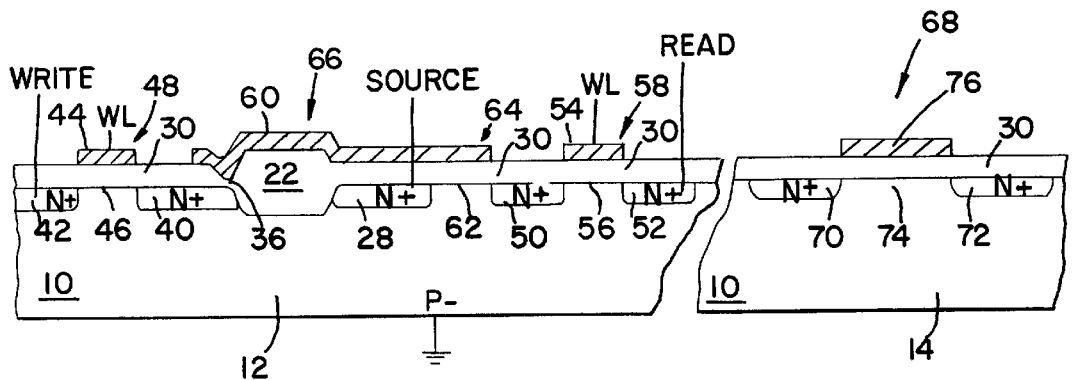

Upon completion of the deuterium annealing process, a photolithographic pattern (not shown) is applied to polycrystalline silicon layer 38, and an RIE process is carried out to form various gate electrodes, as illustrated in FIG. 7. After etching polycrystalline silicon layer 38, an ion implantation process is carried out to form self-align source and drain regions in semiconductor substrate 10. Preferably, arsenic or phosphorus is ion implanted into semiconductor substrate 10 to form source region 40 and drain region 42, which are self-aligned to a gate electrode 44. A channel region 46 underlies gate electrode 44 in silicon substrate 10 and separates source region 40 and drain region 42. Together, source and drain region 40 and 42, gate electrode 44, channel region 46, and gate oxide layer 30 form a write transistor 48 in floating-gate region 12.

Also formed by the ion implantation process are source region 50 and drain region 52, which are self-aligned to a gate electrode 54. A channel region 56 underlies gate electrode 54 and separates source region 50 from drain region 52. Together, source and drain region 50 and 52, gate electrode 54, channel region 56, and gate oxide layer 30 form a read transistor 58.

The polycrystalline silicon etching process also forms a floating gate electrode 60 overlying portions of gate oxide layer 30 and isolation region 22. A portion of floating-gate electrode 60 overlies a channel region 62 in semiconductor substrate 10. Channel region 62 separates doped region 28 from source region 50. Together, doped region 28, source region 50, floating-gate electrode 60, and gate oxide layer 30 form a floating-gate transistor 64.

Write transistor 48, read transistor 58, and floating-gate transistor 64 form the MOS transistor components of an EEPROM memory cell 66. A peripheral transistor 68 is formed at the same time as the transistors in EEPROM memory cell 66. Peripheral transistor 68 is located in peripheral transistor region 14 of semiconductor substrate 12. Peripheral transistor 68 includes a source region 70 and a drain region 72 separated by a channel region 74. A gate electrode 76 overlies channel region 74 and is separated therefrom by gate oxide layer 30. Peripheral transistor 68 can be one of a number of high-voltage MOS transistors formed in peripheral regions of semiconductor substrate 10. For example, peripheral transistor 68 can be an input/output transistor for transferring electrical signals to and from EEPROM memory cell 66. Also, peripheral transistor 68 can be a high-voltage transistor in a high-voltage power supply used to supply programming and erase voltages to EEPROM memory cell 66.

In accordance with the invention, write transistor 48 and read transistor 58 are fabricated to have a channel length on the order of about 0.5 to 0.7 microns. These transistors are intentionally fabricated to have very small gate dimensions in order to fabricate memory cells, such as EEPROM memory cell 66, within a very small surface area on semiconductor substrate 10. However, because high-voltage transistors, such as peripheral transistor 68, must transfer large voltage potentials, peripheral transistor 68 is fabricated to have a transistor gate length that is greater than the MOS transistors fabricated in EEPROM memory cell 66.

An additional improvement realized by the inventive deuterium annealing process, is the ability to reduce the gate length of peripheral transistors, such as peripheral transistor 68. This is because high-voltage transistors fabricated in accordance with the invention show reduced deleterious effects from hot carrier injection. Those skilled in the art will recognize that, generally, hot carrier injection increases with reduced channel length. This is especially pronounced with high-voltage MOS transistors. Hot carrier injection reduces the oxide integrity within the gate oxide region creating charts trapping sites. As charge accumulates within the gate oxide layer at the hot carrier injection induced trapping sites, the threshold voltage of the MOS transistors shift away from the design threshold voltage. The increase in hot carrier induced threshold voltage shifting observed MOS transistors as the gate length is reduced fundamentally limits the amount by which the gate length of a high voltage transistor can be reduced.

By using the inventive process, hot carrier induced defects in the gate oxide are minimized. This allows the gate length of the high voltage transistors to be reduced. Accordingly, the overall dimensions of an EEPROM device can also be reduced, because the larger gate dimensions of the peripheral transistors require a relatively large surface area in which to form these transistors. By fabricating an EEPROM device in accordance with the invention, peripheral transistors can be fabricated to have gate lengths more similar to the gate lengths of the MOS transistors used in the EEPROM memory cells. The net effect of the gate length reduction of the peripheral transistors, then, is to provide an EEPROM device having an overall smaller surface area. In particular, the size of the peripheral transistors can be reduced, such that the gate lengths of the read and write transistors in the EEPROM memory cell are fabricated to a length of about 50 to 80% of the peripheral high voltage transistors.

In one embodiment of the invention, peripheral transistor 68 is fabricated to have a transistor gate length of about 0.6 microns. Depending upon the particular function to be performed by peripheral transistor 68, this transistor can have a gate length that is about 50 to 80% as large as the gate length of the MOS transistors in EEPROM memory cell 66.

In operation, charges are transferred to and from floating-gate electrode 60 through tunnel oxide 36. Once charge has been transferred to floating-gate electrode 60, the long term reliability of EEPROM memory cell 66 depends upon retaining the charge on floating-gate electrode 60. The previously described deuterium annealing process improves the ability of floating-gate electrode 60 to hold charge, and hence show improved data retention, by providing stable deuterium isotopes at the silicon/silicon dioxide interface. The large programming voltages applied across tunnel oxide region 36 result in the transfer of charge across tunnel oxide layer 36. Repeated programming and erase cycles place a large amount of stress on tunnel oxide region 36. However, the inventive deuterium annealing process prevents the formation of charge traps in tunnel oxide region 36, because the deuterium isotope is more resistant to charge-induced migration at the silicon/silicon dioxide interface than is hydrogen. Accordingly, electrical charge can be retained for longer periods of time on floating-gate electrode 60, thus improving data retention of EEPROM memory cell 66.

Without further elaboration, it is believed that one skilled in the art can, using the preceding description, utilize the invention to its fullest extent. The following example will illustrate the invention with more particularity, but is not to be construed as limiting thereof.

EXAMPLE I

Figure 8:
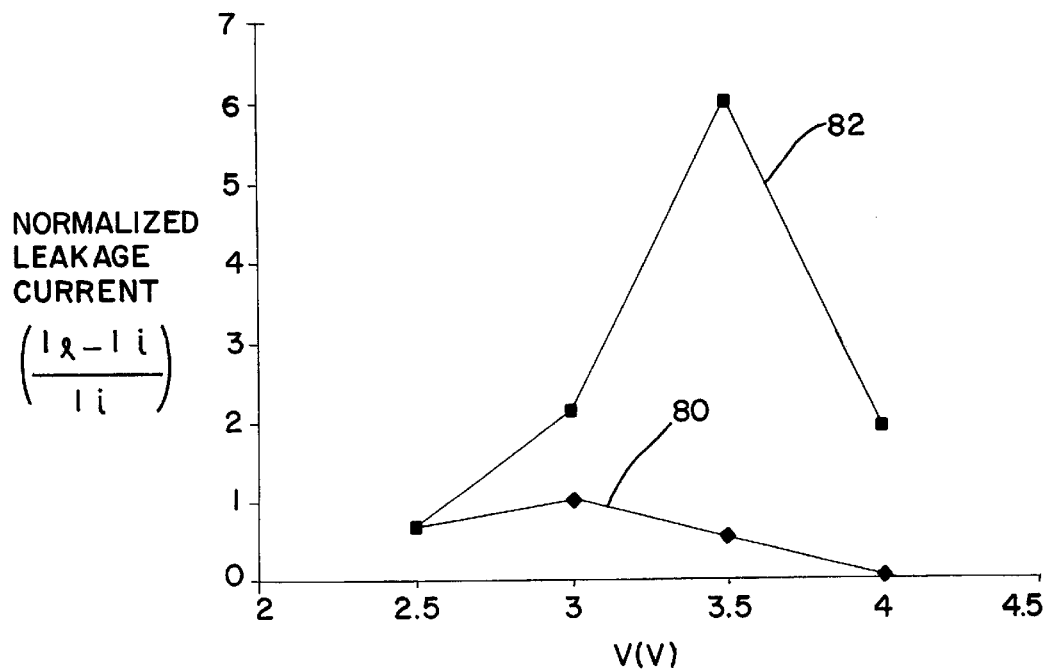
FIG. 8 is a plot of stress-induced leakage current versus gate voltage.

FIG. 8 is a plot of normalized leakage current versus applied voltage for an MOS transistor fabricated in accordance with the prior art, and for an MOS transistor fabricated in accordance with the invention. The stress induced leakage characteristics of the MOS transistor fabricated in accordance with the invention is illustrated by as curve 80 in FIG. 8. For comparison, the stress induced leakage characteristics of the MOS transistor fabricated in accordance with the prior art is illustrated by curve 82. In preparation of the samples, both MOS transistors were fabricated with a gate oxide thickness of about 40 angstroms, and a gate electrode width of about 0.25 microns. The source and drain regions of both transistors were formed by ion implantation of As to a dose of about 1.0EE15 ions per square centimeter at an implantation energy of about 30 keV. The MOS transistor exhibiting the characteristics of plot 80 was annealed in a deuterium atmosphere at a temperature of about 450° C. for a time of about 180 minutes. The deuterium anneal was carried out after deposition of a polycrystalline silicon layer used to form the MOS gate electrodes. The MOS transistor exhibiting leakage current characteristics shown by plot 82 did not receive a deuterium anneal following polycrystalline silicon deposition. Otherwise, all other fabrication processes for both transistors were identical.

The plot shows the normalized leakage current, expressed as the difference between the actual leakage current ($I_l$) and the pre-stressed, or ideal leakage current ($I_i$) divided by the ideal leakage current. Stress was placed on the MOS transistor by applying higher and higher gate voltages, which are plotted on the horizontal axis in volts. As plot 80 indicates, the MOS transistor fabricated in accordance with the invention does not show increase leakage current as the gate voltage increases. In sharp contrast, the prior art transistor of plot 82 shows a dramatic increase in leakage current as higher voltage is applied to the gate electrode. The comparative results show the substantial improvement and stress induced current leakage obtained by MOS devices fabricated in accordance with the invention.

Thus, it is apparent that there has been provided, in accordance with the invention, a method for fabricating a high-density and high-reliability EEPROM device that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various types of semiconductor substrates, such as single crystal silicon, epitaxial silicon, silicon-on-insulator (SOI) substrates, and the like, can be used. Additionally, various types of source and drain extension regions can be used to form drain structures, such as lightly-doped drains (LDD), and the like. It is therefore intended to include within the invention all such variations and modifications has fall within the scope of the appended claims and equivalents thereof.

What is claimed is:

1. A method for fabricating a semiconductor device comprising the steps of:
   providing a semiconductor substrate having a peripheral MOS transistor region, and an EEPROM cell region;
   forming a silicon dioxide layer on the semiconductor substrate overlying the peripheral MOS transistor region and the EEPROM cell region;
   forming a tunnel oxide region overlying the EEPROM cell region;
   forming a polycrystalline silicon layer overlying the silicon dioxide layer and the tunnel oxide region;
   annealing the semiconductor substrate in a deuterium atmosphere to minimize the number of charge trapping sites in the tunnel oxide region and to reduce hot carrier injection in the silicon dioxide layer; and
   patterning the polycrystalline silicon layer to form a peripheral MOS transistor gate electrode overlying the silicon dioxide layer in the peripheral MOS transistor region, and to further form a floating-gate electrode overlying the tunnel oxide region in the EEPROM cell region and a portion of the silicon dioxide layer in the MOS transistor region,
   wherein a stress-induced-leakage-current of the EEPROM cell region is no more than about twice as large as that of an unstressed memory cell.

2. The method of claim 1, wherein the step of annealing comprises the step of annealing in a deuterium gas at a pressure of at least 1 atmosphere and at a temperature of 400° C. to 500° C.

3. The method of claim 2, wherein the step of removing a portion of the silicon dioxide layer overlying the floating-gate transistor region to form a tunnel oxide region comprises the steps of:
   forming a masking pattern on the silicon dioxide layer to define a surface region thereof; and
   etching a portion of the silicon dioxide layer at the surface region and leaving a remaining portion having a thickness of no more than 80 angstroms.

4. The method of claim 2, wherein the step of removing a portion of the silicon dioxide layer overlying the floating-gate transistor region to form a tunnel oxide region comprises the steps of:
   forming a masking pattern on the silicon dioxide layer to define a surface region thereof;
   etching away the silicon dioxide layer at the surface region to expose the semiconductor substrate; and
   regrowing a layer of silicon dioxide to a thickness of no more than 80 angstroms.

5. The method of claim 1, wherein the step of patterning the polycrystalline silicon layer to form a peripheral MOS transistor gate further comprises patterning the polycrystalline silicon layer to form a read MOS transistor gate electrode and a write MOS transistor gate electrode in the EEPROM cell region.

6. The method of claim 5, wherein the step of patterning the polycrystalline silicon layer to form a peripheral MOS transistor gate electrode comprises forming the peripheral MOS transistor gate electrode to have a first gate length, and wherein the step of patterning the polycrystalline silicon layer to form a write MOS transistor gate electrode comprises forming the write MOS transistor gate electrode to have a second gate length, and wherein the second gate length is no less than 50% of the first gate length.

7. The method of claim 6, wherein the second gate length is 50 to 80% of the first gate length.

8. A method for fabricating a semiconductor device having an EEPROM having reduced stress-induced-leakage current comprising the steps of:
   providing a semiconductor substrate having an EEPROM region and a peripheral region;
   forming a relatively thick silicon dioxide layer overlying the semiconductor substrate in the peripheral region;
   forming a relatively thin silicon dioxide layer overlying the semiconductor substrate in the EEPROM region;
   annealing the relatively thick silicon dioxide layer and the relatively thin silicon dioxide layer in a deuterium atmosphere to minimize the number of charge trapping sites in the tunnel oxide region and to reduce hot carrier injection in the silicon dioxide layer;
   forming a high-voltage transistor in the peripheral region, and forming a floating gate transistor in the EEPROM region,
   wherein the relatively thick silicon dioxide layer forms a gate dielectric layer in the high-voltage transistor, and
   wherein the relatively thin silicon dioxide layer forms a tunnel oxide in the floating gate transistor.

9. The method of claim 8, wherein the step of forming a high-voltage transistor comprises forming a transistor having a first gate length, wherein the step of forming a floating gate transistor comprises forming a transistor having a second gate length, and wherein the first gate length is larger than the second gate length.

10. The method of claim 8, wherein the step of annealing comprises the step of annealing in a deuterium gas at a pressure of at least 1 atmosphere and at a temperature of 400° C. to 500° C.

11. A method for fabricating an EEPROM device having reduced stress-induced-leakage current comprising the steps of:
   providing a semiconductor substrate having an EEPROM cell region and a peripheral MOS transistor region;
   forming a read transistor and a write transistor in the EEPROM cell region,
   wherein the read transistor and the write transistor each include a gate oxide layer;
   forming a floating-gate transistor in the EEPROM cell region,
   wherein the floating-gate transistor includes a tunnel oxide region; and
   forming an MOS transistor in the peripheral MOS transistor region,
   wherein the MOS transistor includes a gate oxide layer, and
   wherein a deuterium annealing process is carried out to anneal the tunnel oxide layer to reduce the number of charge trapping sites in the tunnel oxide layer and to reduce hot carrier injection in the gate oxide layer of the read, write, and peripheral MOS transistors.

12. The method of claim 11, wherein the step of forming a read transistor, a write transistor, and a peripheral MOS transistor comprises the steps of:
   forming a silicon dioxide layer on the semiconductor substrate overlying the peripheral MOS transistor region and the EEPROM cell region;
   forming a polycrystalline silicon layer overlying the silicon dioxide layer; and
   patterning the polycrystalline silicon layer to form a peripheral MOS transistor gate electrode, a read MOS transistor gate electrode, and a write MOS transistor gate electrode.

13. The method of claim 12, wherein the step of annealing comprises the step of annealing in a deuterium gas at a pressure of at least 1 atmosphere and at a temperature of 400 to 500° C.

14. The method of claim 13, wherein the step of forming a peripheral MOS transistor comprises forming a transistor having a first gate length, wherein the step of forming a write transistor comprises forming a transistor having a second gate length, and wherein the first gate length is larger than the second gate length.

15. The method of claim 14, wherein the second gate length is 50 to 80% of the first gate length.

16. The method of claim 11, wherein the step of forming a floating-gate transistor comprises the steps of:

forming a silicon dioxide layer on the semiconductor substrate overlying the peripheral MOS transistor region and the EEPROM cell region;

forming a tunnel oxide region on the semiconductor substrate overlying the EEPROM cell region;

forming a polycrystalline silicon layer overlying the tunnel oxide region; and patterning the polycrystalline silicon layer to form a floating-gate electrode overlying the tunnel oxide region.

17. The method of claim 16, wherein the step of annealing comprises the step of annealing in a deuterium gas at a pressure of at least 1 atmosphere and at a temperature of 400° C. to 500° C.

18. The method of claim 16, wherein the step of forming a tunnel oxide region comprises the steps of:

forming a masking pattern on the silicon dioxide layer to define a surface region thereof;

etching away the silicon dioxide layer at the surface region to expose the semiconductor substrate; and regrowing a layer of silicon dioxide to a thickness of no more than 80 angstroms.

19. The method of claim 11, wherein the step of providing a semiconductor substrate comprises providing a semiconductor substrate having an epitaxial silicon layer overlying a single crystal silicon layer.

20. The method of claim 19, wherein the epitaxial silicon layer is doped to have a p-type conductivity.

* * * * *

UNITED STATES PATENT AND TRADEMARK OFFICE
CERTIFICATE OF CORRECTION

PATENT NO. : 6,218,245 B1
DATED : April 17, 2001
INVENTOR(S) : Xiang Qi, Xiao-Yu Li It is certified that error appears in the above-identified patent and that said Letters Patent is hereby corrected as shown below:

Column 4,
Line 59, please replace the word "imlan" with -- implantation --.

Column 5,
Line 5, please replace the word "tie" with -- the --.

Column 8,
Line 25, please replace the formula "1.0EE15" with -- 1.0E15 --.

Signed and Sealed this

Eighth Day of January, 2002

Attest:

Attesting Officer

JAMES E. ROGAN
Director of the United States Patent and Trademark Office